United States Patent [19]

Huang et al.

[11] Patent Number: 4,604,291
[45] Date of Patent: Aug. 5, 1986

[54] METHOD FOR MANUFACTURE OF ALUMINUM-COATED LEAD FRAME

[75] Inventors: Yen-Ching Huang, Ohiso; Hideyasu Nikaido, Oume, both of Japan

[73] Assignees: Tokai University; Sumitomo Metal Mining Company Limited, both of Tokyo, Japan

[21] Appl. No.: 769,470

[22] Filed: Aug. 26, 1985

[30] Foreign Application Priority Data

Aug. 31, 1985 [JP] Japan ................................ 59-182210

[51] Int. Cl.$^4$ .............................................. B05D 3/06
[52] U.S. Cl. ........................................ 427/37; 427/38; 427/91; 427/99; 427/282; 427/287

[58] Field of Search ................... 427/37, 38, 91, 99, 427/282, 287; 204/192 N Primary Examiner—Bernard D. Pianalto
Attorney, Agent, or Firm—Watson, Cole, Grindle & Watson

[57] ABSTRACT

A lead frame with an Al coating which enjoys satisfactory tightness of adhesion and sufficiently low hardness is manufactured by a method, comprising the steps of covering the lead frame with a mask sheet possessing an opening for exposing an inner lead part of the lead frame, keeping the lead frame at a temperature in the range of 100° to 240° C. under a high degree of vacuum exceeding the level of $10^{-5}$ Torr, and depositing aluminum on the inner lead part by arc-discharge type ion plating.

4 Claims, No Drawings

METHOD FOR MANUFACTURE OF ALUMINUM-COATED LEAD FRAME

BACKGROUND OF THE INVENTION

1. Field of the Invention

This invention relates to a method for the manufacture of a lead frame having an inner lead part thereof coated with aluminum.

2. Description of the Prior Art

Ceramic packaging is one of the packaging systems useful for semiconductor integrated circuit (IC) devices. This system achieves the necessary packaging by fastening a lead frame of Fe-Ni alloy to a ceramic substrate possessing a cavity for accommodating an IC device with glass of a low melting point, securing the IC device on the bottom of the cavity in the substrate with solder or glass, connecting an electrode on the IC device to the inner lead part of the lead frame with a bonding wire, setting a ceramic lid in place on the substrate, and sealing the resultant package with glass of a low melting point. Since the package formed by this system excels in heat radiation, the system finds popular utility in applications to IC devices of relatively large output and IC devices which have low heat radiation due to high-speed operation. The following consideration is accorded to this system for the preservation of its reliability.

Generally, the electrodes on the IC devices are made of aluminum (Al). When gold wires are bonded to these Al electrodes, an Au-Al intermetallic compound called "plague phenomenon" is formed at the sites of bonding when the sites are exposed to heat. Since this substance is very brittle, the bonding wires may separate. In the package of this system, therefore, it is necessary to use Al bonding wires. Further, the inner lead part is generally plated with gold or silver to facilitate bonding. When Al wires are connected to the coating of gold or silver, the phenomenon mentioned above occurs at the sites of bonding. As the metal for plating the inner lead part, therefore, adoption of Al is normally expected.

Incidentally, no technique has yet been established for electroplating a given substrate with Al in a wet state. The conventional Al-coating lead frame, therefore, has been manufactured by press punching a strip of clad material having a Al tape applied fast thereon along the central zone thereof.

In the clad material produced in this manner, however, the outer lead must be formed in the portion not covered with the Al tape, i.e., exclusively in the two directions along the opposite edges of the Al strip. As a consequence of the recent advances in the degree of integration of IC devices, the number of electrodes formed on IC devices is increasing. For this reason, the necessity for a lead frame having outer leads extended in the four directions (hereinafter referred to as "quard type lead frame") has been receiving growing recognition. When the lead frame is in such a shape as described above, Al is required to be deposited in the form of spots exclusively in the inner lead part. The lead frame of the foregoing description cannot be obtained from the aforementioned material for the clad and the production of a clad material possessing an Al coating in the form spots is difficult to obtain. For this reason, adoption of means of physical deposition such as the vacuum evaporation method, the ion plating method, or the spattering method have been contemplated. Some of these methods have found utility in actual applications. Unfortunately, none of these methods has been found fully satisfactory.

For example, the vacuum evaporation method has the disadvantage that the Al coating produced is destitute of tightness of adhesion and the Al coating is liable to recrystallize and, due to the heat which is applied during the aforementioned process of packaging, the metal forming the web of the lead frame is diffused into the Al coating to the extent the reflectance of the Al coating is degraded. The recent wire bonder is so advanced as to detect the Al-covered surface based on differences in reflectance and automatic bonding. The degradation of reflectance, therefore, is detrimental to automatic bonding. The ion plating method has the advantage that the coating produced thereby enjoys sufficient tightness of adhesion because it effects deposition of the coating generally by using argon gas at $10^{-2}$ to $10^{-3}$ Torr, ionizing vaporized atoms under glow discharge, and causing the resultant ions to collide against a substrate kept under a potential of $-1$ to $-5$ KV. In the meantime, this method has the disadvantage that this coating has a high hardness. This high level of hardness of the coating may be ascribed to permeation of argon gas in the Al coating. The spattering method utilizes glow discharge of argon gas and, in this respect, equals the ion plating method. The Al coating produced by this method has high hardness. The hardness of the Al coating affects the bonding property of the Al wire. Under the fixed bonding conditions, the fraction of defective bonding decreases in proportion as the hardness decreases. Where a fixed fraction of defective bonding is tolerated, the speed of bonding is increased in proportion to a decrease in hardness.

SUMMARY OF THE INVENTION

This invention has originated in the efforts devoted to the elimination of the disadvantages suffered by the conventional methods as described above. It aims to provide a method for the manufacture of a lead frame possessing an Al coating enjoying sufficient tightness of adhesion, admitting of no degradation of reflectance due to application of heat, and possessing low hardness.

The inventors have developed a theory that by the arc discharge type ion plating which obviates the necessity for a discharge gas, desired reduction of the hardness of the Al coating ought to be attained because the permeation of argon gas in the Al coating ceases to exist. With this theory in mind, they have made various studies and, consequently, found that an Al coating that is satisfactory in terms of tightness of adhesion, reflectance, and hardness is obtained by depositing aluminum on the lead frame as a substrate under a degree of vacuum exceeding the level of $10^{-5}$ Torr while keeping the temperature of the lead frame in the range of 100° to 240° C. This discovery has led to perfection of the present invention.

DETAILED DESCRIPTION OF THE INVENTION

The arc discharge type ion plating method has no use for any gas for the purpose of electric discharge. It, therefore, makes use of an ionizing electrode biassed by 50 to 100 V relative to an evaporation source for the ionization of vaporized atoms. By the ionizing electrode, thermoelectrons and secondary electrons issuing from the evaporation source are accelerated and caused to collide with vaporized atoms to effect necessary ionization and induce the arc discharged.

For the method of this invention, the degree of vacuum and the temperature of the substrate are important factors. The vacuum is required to be maintained above a high level of $10^{-5}$ Torr. If the degree of vacuum falls short of reaching this level of $10^{-5}$ Torr, the deposited aluminum is oxidized with the oxygen present in the residual gas or the oxygen generated by the decomposition of a minute amount of water adhering to the Al evaporation source and the aluminum is attains abnormal growth. Thus, the Al coating eventually obtained acquires a rough surface. The Al coating produced at all under these conditions possesses insufficient electric conductivity. During the course of the ion plating, therefore, the degree of vacuum must be maintained above the level of $10^{-5}$ Torr. Although, it is desired to have the degree of vacuum as high as possible, the practical range of vacuum has its upper limit at $10^{-7}$ Torr, which is the level attainable by the use of an oil diffusion pump. Any increase of the degree of vacuum beyond the level of $10^{-7}$ Torr necessitates use of an ion pump or a cryopump. This device is so expensive as to jeopardize the economy of the method itself.

It is also necessary that the temperature of the lead frame constituting a substrate for the deposition of the Al coating should be maintained in the range of 100° to 240° C. If this temperature is less than 100° C., the Al coating exhibits insufficient tightness of adhesion. This tightness of adhesion is heightened with the rising temperature of the substrate. If the temperature of the substrate is increased excessively, however, the Al coating grows more liable to recrystallization and the metal forming the web of the lead frame is diffused into the Al coating by the heat applied during the aforementioned process of packaging, with the result that the reflectance of the Al coating will be degraded. This diffusion of the metal becomes prominent when the temperature of the substrate during the deposition of Al rises beyond 240° C. Thus, the temperature of the lead frame must be maintained within the range of 100° to 240° C., preferably in the range of 150° to 200° C.

EXAMPLE

For the experiment described below, an arc discharge type ion plating apparatus was used which incorporated a vacuum vessel of the shape of a vertical cylinder. Inside the vacuum vessel, a copper crucible was disposed in the lower central part and a bar-shaped ionizing electrode was disposed above the crucible, with means provided therein for a given substrate to be disposed as opposed to the crucible at a position about 15 cm above the crucible. Behind the substrate was located a heater adapted to adjust the temperature of the substrate. Below the crucible was disposed a 225° C. deflection electron gun intended to heat the evaporation source. The aforementioned crucible was charged with Al of purity of 99.999%. A quad type lead frame of 42 alloy (consisting of 42% of Ni and the balance of Fe) having 108 leads was used as the substrate. This lead frame was nipped between a mask plate of stainless steel containing an opening 15 mm square and a repressing plate. Then, the interior of the vacuum vessel was evacuated to $5 \times 10^{-6}$ Torr and vacuum deposition of Al was tried, with the temperature of the substrate changed to 40° C., 100° C., 150° C., 200° C., 250° C., and 300° C. The speed of Al vacuum deposition was fixed at about 1 μm per minute. The vacuum deposition was continued for two minutes at each of the varied steps of substrate temperature. During the course of the vacuum deposition, the internal pressure of the vacuum vessel was maintained in the range of 9 to $10 \times 10^{-6}$ Torr.

The Al coating consequently obtained was tested for tightness of adhesion, thermal properties, and hardness. The results are shown in Table 1. The methods used for the test were as follows:

(i) Tightness of adhesion—An adhesive tape (product of 3M of the U.S. marketed under trademark designation of "Scotch Tape") was applied to the Al coating and then ripped off. The tightness of adhesion was evaluated on the basis that the Al coating, when rejectable, would separate from the substrate by the adhesive tape. It was rated on a three-point scale, wherein the mark of a blank circle, O, stands for absolute absence of discernible separation, the mark of a triangle, Δ, for presence of partial discernible separation, and the mark of a cross, X, for complete separation throughout the entire surface.

(ii) Thermal treatment—A given sample was heated at 450° C. for ten minutes in an atmosphere of nitrogen. After the heating, the sample was examined by X-ray diffraction to determine whether or not the metal of the substrate had been diffused in the surface of the Al coating. The diffusion was rated on a two-point scale, wherein the mark of a blank circle, O, stands for absence of discernible diffusion of Fe and Ni and the mark of a cross, X, for presence of discernible diffusion.

(iii) Hardness—The hardness of the Al coating was measured with an ultrafine hardness meter under 30 seconds' application of a load of 0.5 g.

TABLE 1

| Temperature of substrate (°C.) | Tightness of adhesion | Thermal treatment | Hardness (kg/mm$^2$) | Remarks |
| --- | --- | --- | --- | --- |
| 40 | X | O | 27 | Comparative experiment |
| 100 | Δ | O | 20 | Example of this invention |
| 150 | O | O | 17 | Example of this invention |
| 200 | O | O | 16 | Example of this invention |
| 250 | O | X | 16 | Comparative experiment |
| 300 | O | X | 16 | Comparative experiment |

It is noted from the results of Table 1 that the temperature of the substrate is required to exceed 100° C. from the standpoint of tightness of adhesion and is desired not to exceed 250° C. from the standpoint of thermal treatment. The results of a further study conducted by the inventors indicate that the upper limit of the temperature of the substrate at which the diffusion of the metal of the substrate in the Al coating can be repressed is roughly 240° C. It is noted from Table 1 that for production of a satisfactory Al coating, the temperature of the substrate has to be maintained in the range of 150° to 200° C.

The hardness of the Al coating obtained by the method of this invention, measured with the ultrafine hardness meter, is about 17 kg/mm$^2$, a value about one third of the hardness of the Al coating obtained by the conventional ion plating method or the spattering method. Owing to this generous decrease of the hardness of the Al coating, the bonding property of the Al wire is exceptionally satisfactory. This fact contributes to decreasing the fraction of defective bonding and increasing the bonding speed.

Another advantage of the method of this invention resides in the fact that the scattering of Al ions is notably decreased because this method has no use for argon gas. As the result, the area accuracy of the Al coating in the form of spots is enhanced strikingly. Moreover, the amount of Al suffered to adhere to other parts than the substrate within the vacuum vessel is decreased so much as to improve the material efficiency.

This invention permits production of a lead frame possessing an Al coating which enjoys satisfactory tightness of adhesion and which suits wire bonding. Thus, it has established a technique capable of amply coping with the recent trend toward growth of the number of leads in the lead frame.

We claim:

1. A method for the manufacture of an aluminum-coated lead frame for semiconductor integrated circuit devices, said method including the steps of covering said lead frame with a mask sheet possessing an opening for exposing an inner lead part of said lead frame, maintaining said lead frame at a temperature in a range of 100° to 240° C. and under a high degree of vacuum exceeding the level of $10^{-5}$ Torr, and depositing aluminum on said inner lead part by arc-discharge type ion plating.

2. A method according to claim 1, wherein said degree of vacuum is maintained in a range of $10^{-5}$ Torr to $10^{-7}$ Torr.

3. A method according to claim 1, wherein said temperature of said lead frame is maintained in a range of 150° to 200° C.

4. A method according to claim 1, wherein said arc-discharge ion plating is effected by the use of an ionizing electrode biassed by 50 to 100 V relative to an evaporation source, for ionization of vaporized atoms.

* * * * *